United States Patent [19]

Simpson

[11] 4,047,963
[45] Sept. 13, 1977

[54] PHOTOPOLYMER COMPOSITIONS

[75] Inventor: David A. Simpson, Wilmington, Del.

[73] Assignee: Hercules Incorporated, Wilmington, Del.

[21] Appl. No.: 697,072

[22] Filed: June 17, 1976

[51] Int. Cl.$^2$ .............................................. G03C 1/68
[52] U.S. Cl. .................................... 96/115 R; 96/35.1
[58] Field of Search ............... 96/115 R, 115 P, 35.1, 96/86 P; 204/159.11; 260/47

[56] References Cited

U.S. PATENT DOCUMENTS

| | | | |
|---|---|---|---|
| 3,074,869 | 1/1963 | Workman | 204/158 |
| 3,231,377 | 1/1966 | Dickinson | 96/33 |
| 3,231,378 | 1/1966 | Silver | 96/33 |
| 3,231,381 | 1/1966 | Dickinson et al. | 96/75 |
| 3,231,382 | 1/1966 | Silver | 96/85 |
| 3,409,593 | 11/1968 | Messwarb et al. | 260/47 |
| 3,417,051 | 12/1968 | Messwarb et al. | 260/47 |
| 3,417,052 | 12/1968 | Messwarb et al. | 260/47 |
| 3,708,296 | 1/1973 | Schlesinger | 96/33 |
| 3,711,390 | 1/1973 | Feinberg | 204/159.11 |
| 3,740,224 | 6/1973 | Barzynski et al. | 96/33 |

*Primary Examiner*—John D. Welsh
*Attorney, Agent, or Firm*—Marion C. Staves

[57] ABSTRACT

It has been found that printing elements can be prepared from a water-soluble photopolymer composition comprising (1) a water-soluble thermoplastic ethylene oxide copolymer containing 50–96% ethylene oxide; (2) from about 0.5 to about 25% by weight based on the ethylene oxide copolymer of an ethylenically unsaturated monomer having its unsaturation in the form of at least two

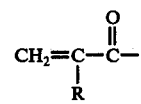

groups, wherein R is hydrogen or a $C_1$–$C_3$ alkyl group, and (3) from about 0.1 to about 10% by weight based on the ethylene oxide copolymer of a photoinitiator thermally stable at temperatures up to about 150° C. The above described photopolymer composition can be thermoformed, such as by extrusion or compression molding.

22 Claims, No Drawings

PHOTOPOLYMER COMPOSITIONS

This invention relates to water-soluble photopolymer compositions, photopolymer elements, and processes of making printing reliefs from such elements. More particularly this invention relates to water-soluble photopolymer compositions based on (1) copolymers of ethylene oxide, (2) ethylenically unsaturated monomers, and (3) a photoinitiator; photopolymer elements prepared from such compositions; and to processes of making printing reliefs from such elements.

Compositions capable of being converted under the influence of actinic light to rigid, insoluble, tough structures have become increasingly important in the preparation of printing plates. One of the fundamental patents relating to such compositions is U.S. Pat. No. 2,760,863 to Plambeck. In the process of the Plambeck patent, printing plates are produced directly by exposing to actinic light through an image-bearing process transparency a layer of an essentially transparent composition containing an addition polymerizable, ethylenically unsaturated monomer and an addition polymerization initiator activatable by actinic light. The layer of polymerizable composition is supported on a suitable support, and exposure of the composition is continued until substantial polymerization of the composition has occurred in the exposed areas with substantially no polymerization occurring in the nonexposed areas. The unchanged material in the latter areas then is removed, as by treatment with a suitable solvent in which the polymerized composition in the exposed areas is insoluble. This results in a raised relief image which corresponds to the transparent image of the transparency and which is suitable for use as a printing plate, as in letterpress and dry offset work.

Photopolymerizable compositions of the type of the Plambeck patent generally are prepared from polymeric components which are soluble in organic solvents. Accordingly, development of printing plates based on such compositions has required the use of organic solvents or of solutions containing high percentages of organic solvents. Due to the high volatility and generally low flash point of low cost organic solvents, their use often gave rise to hazardous conditions. As a consequence, further research was directed, and led, to the development of several photopolymer compositions which are soluble in water or aqueous alkali. For example, these layers have utilized polymeric components containing lateral acid groups, or the soluble salts thereof.

Also disclosed in the prior art are photopolymer compositions containing (1) poly(ethylene oxide), (2) a polycarboxylic acid, (3) an unsaturated monomer and (4) a photoinitiator (as disclosed in U.S. Pat. No. 3,740,224) or compositions containing (1) poly(ethylene oxide), (2) a heat-fusible phenolic resin and (3) a photosensitizer. These compositions, however, cannot be thermoformed for practical commercial production and dissolve only with the use of aqueous or alcoholic caustic solutions. It should also be mentioned that where compositions containing unreacted poly(ethylene oxide) are stored (particularly at slightly elevated temperatures) the poly(ethylene oxide) has a tendency to crystallize and films containing these materials become translucent or opaque due to this crystallization and do not transmit light in the required manner.

Now, in accordance with this invention, a photopolymer composition based on ethylene oxide copolymers has been discovered which not only is soluble in water and thermoplastic, permitting aqueous development and low temperature fabrication, but also does not crystallize on storage. The photopolymer composition of this invention comprises (1) a water-soluble, thermoplastic copolymer of ethylene oxide containing 50–97% ethylene oxide and having a reduced specific viscosity (RSV) of from about 0.4 to about 50, which corresponds to a weight average molecular weight of from about 20,000 to about 3,000,000; (1) from about 0.5 to about 25% by weight, based on the ethylene oxide copolymer, of an ethylenically unsaturated monomer having its unsaturation in the form of at least two

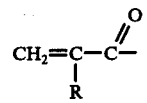

groups, wherein R is hydrogen or a $C_1$–$C_3$ alkyl group; and (3) from about 0.1 to about 10% by weight, based on the ethylene oxide copolymer, of a photoinitiator. By the term "reduced specific viscosity" is meant the $\eta_{sp/c}$ determined on a 1.0% w/v solution of the copolymer in water at 25° C. The above photopolymer composition is readily applied in film or layer form from solutions in water or by conventional coating, extruding or calendering procedures. After exposure through a process transparency, the composition is readily developed with water to form printing reliefs, thus obviating the need for caustic solutions or organic solvents, although organic solvents can be used either alone or in combination with water, if desired.

This invention also includes elements suitable for the preparation of printing relief images comprising an adherent support having deposited thereon a solid layer of the photopolymer composition of this invention. This layer will generally be from 3 to 250 mils in thickness. There may be disposed between the support and the solid layer of photopolymer composition an intervening layer of a resin or polymer which is adherent to both the support and the layer of photopolymer composition. This intervening layer advantageously is absorptive of actinic light. As such, the adsorptive layer preferably contains a pigment, such as carbon black, which is light absorbing over a broad spectral range. Such an absorptive layer functions as an antihalation layer by decreasing reflectance when the support material is light reflective. For example, metal plates or foils are very useful because of their desirable physical properties.

The photopolymer composition of this invention is advantageous in that the physical properties of the cured composition can be varied from a hard, tough layer to a soft, rubbery material simply by controlling the composition of the ethylene oxide polymers. In general, the higher the ethylene oxide content, the harder the composition. Thus, the composition of this invention is not only useful for preparation of conventional letterpress printing plates, e.g., for the newspaper industry, but is also useful for preparing flexographic printing plates for the commercial printing industry.

The photopolymer composition of this invention may be cast from solution onto a suitable support such as a grained aluminum or steel sheet or a polyester film. Alternatively, it preferably may be thermoformed in plastic fabrication equipment onto such metal or synthetic resin substrates. In the solution procedure, a solvent solution of the ethylene oxide copolymer may be prepared at concentrations of 5–20% by weight, and the ethylenically unsaturated monomer and photoinitiator added thereto. The solution is then poured onto the support, spread over its surface with the aid of a doctor blade and the solvent allowed to evaporate. Films having a thickness of three mils or more are conveniently prepared this way.

In the preferred thermoforming procedure, the ingredients of the composition may first be dry-blended in a mill, Blendor or tumbling device to provide an intimately mixed dry composition. The ingredients are then further mixed in the melt by two-roll milling or extrusion at temperatures between about 40° and about 150° C. This mixture then is fabricated into a printing plate blank by compression molding or extrusion onto a metal or synthetic resin backing. Films having a thickness of, for example, 25 mils or more are most easily prepared by the thermoforming technique.

The ethylene oxide copolymer which constitutes the major component of the photopolymer composition of this invention contains 50 to 96% ethylene oxide, preferably 75 to 95%. The comonomer or comonomers may be any materials which are copolymerizable with ethylene oxide. Preferred comonomers are compounds containing an oxirane group and containing three to eight carbon atoms. Especially preferred are compounds containing an oxirane group and ethylenic unsaturation.

Exemplary of epoxide comonomers are the alkylene oxides such as propylene oxide, 1-butene oxide, cis-2-butene oxide, trans-2-butene oxide, isobutylene oxide, 2-pentene oxide, 1-hexene oxide, and the like; the cycloaliphatic oxides such as cyclohexane oxide, vinylcyclohexane oxide, and the like; arylalkylene oxides such as styrene oxide, and the like; unsaturated alkylene oxides such as butadiene monoxide, divinylbenzene monoxide, vinylcyclohexene monoxide, and the like; epoxy ethers such as alkyl glycidyl ethers, as for example, methyl glycidyl ether, ethyl glycidyl ether, isopropyl glycidyl ether, t-butyl glycidyl ether, n-pentyl glycidyl ether, and the like; aryl glycidyl ethers and substituted aryl glycidyl esters, such as phenyl glycidyl ether, p-chlorophenyl glycidyl ether, o-chlorophenyl glycidyl ether, and the like; unsaturated glycidyl ethers such as the alkenyl glycidyl ethers as, for example, vinyl glycidyl ether, allyl glycidyl ether, and the like; the alkenyl aryl glycidyl ethers such as o-allylphenyl glycidyl ether, p-crotylphenyl glycidyl ether, and the like; the heterocyclic epoxides such as 5,6-epoxy-1,3-dioxepane, 2-methyl-5,6-epoxy-1,3-dioxepane, 2,2-dimethyl-5,6-epoxy-1,3-dioxepane, 3,4-epoxy-tetrahydropyran, and the like; glycidyl esters such as glycidyl acetate, glycidyl propionate, glycidyl pivalate, glycidyl methacrylate, glycidyl acrylate, and the like; alkyl glycidates such as methyl glycidate, ethyl glycidate, and the like; haloalkylene oxides such as epifluorohydrin, epichlorohydrin, epibromohydrin, 2-methyl-3-chloro-1,2-epoxypropane, 2-methyl-3-bromo-1,2-epoxybutane, 1,2-dichloro-3,4-epoxybutane, 1,4-dibromo-2,3-epoxybutane, 1-chloro-3,4-epoxybutane, 1-chloro-4,5-epoxypentane, 1-bromo-3,4-epoxybutane, 1-fluoro-3,4-epoxybutane, 1-bromo-4,5-epoxybutane, 2-chloro-3,4-epoxybutane, 1,1-dichloro-2,3-epoxypropane, 1,1,1-trichloro-2,3-epoxypropane, 1,1,1-trichloro-3,4-epoxybutane, 1,1,1-trifluoro-2,3-epoxypropane, 1,1,1-trifluoro-3,4-epoxybutane, 1,1,1-tribromo-3,4-epoxybutane, and the like; haloalkyl glycidyl ethers such as 2,2-bis(chloromethyl) ethyl glycidyl ether, 2-chloroethyl glycidyl ether, 2-bromoethyl glycidyl ether, 2-chloro-1-methylethyl glycidyl ether, 2,2,2-tris (chloromethyl)ethyl glycidyl ether, and the like; haloalkylaryl glycidyl ethers such as chloromethylphenyl glycidyl ether, and the like. Exemplary of oxetane comonomers are oxetane (also known as trimethylene oxide), 2-methyl oxetane, 2-ethyl oxetane, 2-butyl oxetane, 2-cyclohexyl oxetane, 2-methoxy oxetane, 2-ethoxy oxetane, 2-propoxy oxetane, 2-hexoxy oxetane, 2-methoxymethyl oxetane, 2-butoxymethyl oxetane, 2-benzyl oxetane, 2-phenoxy oxetane, 2-benzyloxymethyl oxetane, 2-allyl oxetane, 2-phenoxy oxetane, 2-benzyloxymethyl oxetane, 2-allyl oxetane, 2-vinylbenzene oxetane, 2,2-dimethyl oxetane, 2-methoxy-2-methyl oxetane, 2-methallyl-2-methyl oxetane, 2-methyl-3-methyl oxetane, 3-methyl oxetane, 3-butyl oxetane, 3-cyclohexyl oxetane, 3-phenyl oxetane, 3-allyl oxetane, 3-methoxy oxetane, 3-hexoxy oxetane, 3-methoxymethyl oxetane, 3,3-dimethyl oxetane, 3,3-diisopropyl oxetate, 3-methoxy-3-methyl oxetane, 3-ethoxymethyl-3-methyl oxetane, 3,3-bis(phenoxymethyl) oxetane, 3-vinyl-3-methyl oxetane, 3,3-bis(allyl) oxetane, 2,3,4-trimethyl oxetane, 2,4-dimethyl oxetane, and the like; haloalkyl and haloalkoxy oxetane such as 2-chloromethyl oxetane, 2-$\beta$-bromoethyl oxetane, 2-fluoromethyl oxetane, 2-trifluoromethyl oxetane, 2-$\beta$-chlorobutyl oxetane, 2-fluoromethoxy oxetane, 2-chloromethoxy oxetane, 2-bromomethoxy oxetane, 2-bromomethoxy oxetane, 2-$\beta$-chloroethoxy oxetane, 2-$\beta$-bromobutoxy oxetane, 2-fluoromethoxy methyl oxetane, 2-$\beta$-chloroethoxy methoxy oxetane, 3-$\beta$-bromoisopropoxy methyl oxetane, 3-chloromethyl oxetame. 3-$\beta$-bromoethyl oxetane, 3-trifluoromethyl oxetane, 3-$\beta$-chlorobutyl oxetane, 3,3-bis(chloromethyl) oxetane, 3,3-bis(fluoromethyl) oxetane, 3,3-bis(bromomethyl) oxetane, 3-fluoromethoxy oxetane, 3-chloromethoxy oxetane, 3-bromomethoxy oxetane, 3-$\beta$-chloroethoxy oxetane, 3-$\beta$-bromobutoxy oxetane, 3-$\beta$-fluorooctoxy oxetane, 3-fluoromethoxy methyl oxetane, 3-$\beta$-chloroethoxy methyl oxetane, 3-$\beta$-bromoisopropoxy methyl oxetane, and the like. Exemplary of the furan comonomers are the tetrahydrofurans such as tetrahydrofuran, 2-methyltetrahydrofuran, 2,3,4-trimethyltetrahydrofuran, and the like, halo-tetrahydrofurans such as 3-($\beta$-chloroethyl)-tetrahydrofuran, 2-trifluoromethyltetrahydrofuran, 2,3,4-tris(trifluoromethyl)-tetrahydrofuran, and the like.

The importance of utilizing one or more comonomers to at least 4% is to insure that crystallization of the film composition does not occur on storage. Since poly-(ethylene oxide) is a crystalline material, films containing it tend to crystallize producing opaque or translucent films. Such films will not transmit light in a manner required to give satisfactory images for printing plate preparation. A content of 50% ethylene oxide in the copolymer provides the desired water solubility for etching or dissolving away the polymer formulation from unexposed areas.

The reduced specific viscosity of the polymer should be in the range of 0.4 to 50 determined at 1% in water at 25°, which corresponds to a molecular weight of about 20,000 to 3 million. The lower level is that required to produce a solid polymer of suitable physical properties, particularly strength, flexibility, and abrasion resistance required for production during cure of a printing plate effective over a long period of use. Molecular weights above 3 million may be undesirable because of a slow etch rate.

The ethylenically unsaturated monomer components of the compositions of this invention have their unsaturation in the form of at least two $$CH_2=C-C- \overset{O}{\underset{R}{\|}}$$

groups, wherein R is hydrogen or a $C_1-C_3$ alkyl group. A useful monomer is 1,3,5-triacryloylhexahydro-1,3,5-triazine. This compound and related compounds such as the corresponding methacryloyl derivative have the structural formula

I.

$$\text{(structure shown)}$$

wherein R is hydrogen or a $C_1-C_3$ alkyl group.

Other suitable monomers may be defined by the structural formula

II.

$$CH_2=\underset{R}{\overset{|}{C}}-\overset{O}{\overset{\|}{C}}-X-A-X-\overset{O}{\overset{\|}{C}}-\underset{R}{\overset{|}{C}}=CH_2$$

wherein R again is hydrogen or a $C_1-C_3$ alkyl group, both X's are either —NR— or —O— and A is alkylene, substituted alkylene or alkylene oxy alkylene. Exemplary of the latter are those compounds having the formula

III.

$$CH_2=\underset{R}{\overset{|}{C}}-\overset{O}{\overset{\|}{C}}-NH-CH_2OCH_2-NH\overset{O}{\overset{\|}{C}}-\underset{R}{\overset{|}{C}}=CH_2$$

A preferred monomer having this formula is N,N'-oxydimethylene-bis(acrylamide).

When X in formula II above again is —NR—, but A is alkylene or substituted alkylene, this is descriptive of another preferred monomer, N,N'-methylene-bis(acrylamide). This compound is one member of a valuable group of monomers represented by compounds having the formula

IV.

$$CH_2=\underset{R}{\overset{|}{C}}-\overset{O}{\overset{\|}{C}}-NR-(CHR')_n-NR-\overset{O}{\overset{\|}{C}}-\underset{R}{\overset{|}{C}}=CH_2$$

wherein R is hydrogen or a $C_1-C_3$ alkyl group, R' is hydrogen, a $C_1-C_3$ alkyl group or phenyl, $n$ is 1 to 6 when R' is hydrogen and 1 when R' is $C_1-C_3$ alkyl or phenyl group.

Representative of compounds of formula IV above are N,N'-methylene-bis(acrylamide), N,N'-methylene-bis(methacrylamide), N,N'-methylene-bis(α-ethylacrylamide), N,N'-methylene-bis(α-propylacrylamide), N,N'-ethylene-bis(acrylamide), N,N'-ethylene-bis(methacrylamide), N,N'-(1,6-hexamethylene)-bis(acrylamide), N,N'- (1,6-hexamethylene)-bis(methacrylamide), N,N'-ethylidene-bis(acrylamide), N,N'-ethylidene-bis(methacrylamide), N,N'-propylidene-bis(acrylamide) and N,N'-methylene-bis(N-methyl acrylamide). These compounds may be prepared by conventional reactions well known in the art, for example, in U.S. Pat. No. 2,475,846.

Also useful monomers are those wherein X in formula II above is —O—. When A is alkylene or substituted alkylene, the compounds are polyacrylates of certain polyhydric alcohols. These acrylates may be illustrated by the following formulas.

When A is alkylene, this is descriptive of compounds having the formulas

V.

$$CH_2=\underset{R}{\overset{|}{C}}-\overset{O}{\overset{\|}{C}}-O-(CHR')_m-O-\overset{O}{\overset{\|}{C}}-\underset{R}{\overset{|}{C}}=CH_2$$

wherein R is hydrogen or a $C_1-C_3$ alkyl group, R' is hydrogen, a $C_1-C_3$ alkyl group or phenyl, $m$ is 1 to 8 when R' is hydrogen and 1 when R' is $C_1-C_3$ alkyl or phenyl, and

VI.

$$CH_2=\underset{R}{\overset{|}{C}}-\overset{O}{\overset{\|}{C}}-O-(CH_2)_n-CHR''-O-\overset{O}{\overset{\|}{C}}-\underset{R}{\overset{|}{C}}=CH_2$$

wherein R is hydrogen or a $C_1-C_3$ alkyl group and R'' is a $C_1-C_4$ alkyl group, and $n$ is 1 to 4.

Representative of compounds of formula V are ethylene glycol diacrylate, ethylene glycol dimethacrylate, ethylene glycol di(α-ethylacrylate), ethylene glycol di(α-propylacrylate), 1,3-propylene glycol diacrylate, 1,4-butylene glycol diacrylate, 1,8-octanediol dimethacrylate, and ethylidene-bis(acrylate).

Representative of compounds of formula VI are 1,2-propylene glycol diacrylate, 1,3-butanediol dimethacrylate, and 1,2-butanediol diacrylate.

When X in formula II is O and A is substituted alkylene, this is descriptive of compounds having the formulas

VII.

$$CH_2=\underset{R}{\overset{|}{C}}-\overset{O}{\overset{\|}{C}}-O-CH_2-(CH)_a-CH_2-O-\overset{O}{\overset{\|}{C}}-\underset{R}{\overset{|}{C}}=CH_2$$
$$\underset{OR'''}{|}$$

wherein R is hydrogen or a $C_1-C_3$ alkyl group, R''' is hydrogen or a $$-\overset{O}{\overset{\|}{C}}C-\underset{R}{\overset{|}{=}}CH_2$$

group and $a$ is 1 to 4,

VIII.

-continued

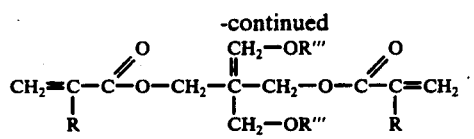

wherein R is hydrogen or a $C_1-C_3$ alkyl group and R''' is hydrogen or a

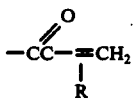

group, and

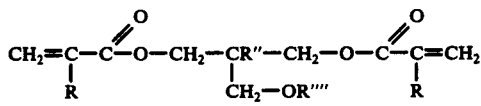                                                             IX.

wherein R is hydrogen or a $C_1-C_3$ alkyl group, R''' is hydrogen or a

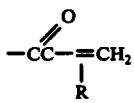

group and R''' is a methyl or ethyl group.

Representative of compounds of formula VII are glycerol triacrylate, 1,3-glycerol dimethacrylate, erythritol diacrylate, mannitol diacrylate and mannitol trimethacrylate.

Representative of compounds of formula VIII are pentaerythritol diacrylate, pentaerythritol triacrylate, pentaerythritol tetraacrylate and pentaerythritol tetramethacrylate.

Representative of compounds of formula IX are trimethylolethane diacrylate, trimethylolpropane triacrylate and trimethylolpropane dimethacrylate.

Closely related to the preceding acrylates are those which are derived from di-, tri-, and tetra-ethylene glycol and di-, tri-, and tetra-propylene glycol. These compounds are those of formula II wherein X is —O— and A is alkylene oxyalkylene, and they may be more specifically illustrated by the formula

wherein R is hydrogen or a $C_1-C_3$ alkyl group R''''' is hydrogen or methyl and n is 2 to 4. Representative of these compounds are diethylene glycol diacrylate, diethylene glycol dimethacrylate, triethylene glycol diacrylate, triethylene glycol dimethacrylate, tetraethylene glycol diacrylate, tetraethylene glycol dimethacrylate, dipropylene glycol diacrylate, dipropylene glycol dimethacrylate, tripropylene glycol diacrylate, tripropylene glycol dimethacrylate and tetrapropylene glycol diacrylate.

The amount of monomer used to effect crosslinking of the ethylene oxide copolymer component of the compositions of this invention may be from about 0.5 to about 25% preferably from about 2 to about 20%, by weight based on the ethylene oxide copolymer. In many instances, the amount of monomer needed to obtain effective crosslinking of the ethylene oxide copolymer will be no more than about 10–15% by weight based on the ethylene oxide coplymer.

The photoinitiators of the compositions of this invention are generally well known and some are characterized by the art as being photoreducible. They are compounds which absorb actinic light strongly and thus become activated to the point where they will abstract hydrogen atoms from compounds which are hydrogen donors. By so doing, the photoinitiator is itself reduced and the hydrogen donor is converted into a free radical. Representative compounds are benzophenone, 2-chlorobenzophenone, 4-methoxybenzophenone, 4-methylbenzophenone, 4,4'-dimethylbenzophenone, 4-chloro-4'-methylbenzophenone, 3-methylbenzophenone, 4-tert-butylbenzophenone, benzoin, benzoin methyl ether, benzoin ethyl ether, benzoin isopropyl ether, benzoin acetate, benzil, benzilic acid, methylene blue, acetophenone, 9,10-phenanthrenequinone, and 1,4-naphthoquinone. Particularly suitable are benzophenone and the substituted benzophenones in which the substitute groups are halogen, hydroxyl, carboxyl, carboalkoxy, alkyl, alkoxy, amino or mono- or dialkyl-substituted amino groups. The alkyl in any of these substituent groups may contain from one to five carbon atoms. Also applicable are combinations of carbonyl sensitizer compounds and certain organic amine activators as disclosed in U.S. Pat. No. 3,759,807. In general, the photoinitiator should be thermally stable at temperatures up to about 150° C. Stability at such temperatures prevents premature crosslinking when the compositions of this invention are prepared by thermoforming procedures or during storage. Such stability also minimizes, during exposure, any crosslinking in the unexposed areas caused by the heat generated in the crosslinking reaction and by the heat transmitted through the opaque sections of the transparency. The amount of photoinitiator may be from about 0.1 to about 10% , preferably from about 1.0 to about 5.0%, by weight based on the ethylene oxide copolymer in the photopolymer composition.

For the purpose of inhibiting premature crosslinking during thermal processing of the photopolymer composition of this invention, the incorporation of a phenolic stabilizer is desirable. Such stabilizers also are well known in the art, and they are exemplified by di-t-butyl-p-cresol, hydroquinone monomethylether, pyrogallol, quinone, hydroquinone, methylene blue, t-butyl catechol, hydroquinone monobenzyl ether, methyl hydroquinone, amyl quinone, amyloxy hydroquinone, n-butyl phenol, phenol and hydroquinone monopropyl ether. When used in an amount within the range of from about 0.001 to about 1% by weight of the ethylene oxide copolymer, these stabilizers are quite effective in preventing crosslinking of the photopolymer composition during thermal processing. During exposure such amounts of stabilizer also delay and thus prevent crosslinking due to scattered light in the non-exposed areas of the composition, but do not greatly interfere with or delay the crosslinking of the composition in strongly exposed areas, thus aiding in formation of a plate of optimum depth and surface configuration.

The photopolymer composition also may contain up to about 55% by weight of an inert particulate filler which is essentially transparent to actinic light. Representative of such fillers are the organophilic silicas, the bentonites, silica and powdered glass, all having a particle size less than 0.4 mil in their maximum dimension. Particles of 0.1 micron or less in size are preferred. Such fillers can impart desirable properties to the composition of this invention. Furthermore, the light scattering effected by the particulate fillers broadens the image toward the base of the plate so that the half-tone dots take on the appearance of truncated cones in cross-section. Such dots are stronger and have less tendency to break off than dots which are more cylindrical in cross-section.

When a photopolymer element of this invention is exposed to actinic light through a photomechanical negative or positive, the ethylene oxide copolymer beneath the exposed areas becomes insolubilized, whereas the copolymer beneath the unexposed areas remains water soluble. Subsequent washing of the plate removes the soluble polymer, leaving a replica of the negative or positive in relief. Development may frequently be accelerated by brushing or scrubbing. In large scale work, application of the water solvent will advantageously be carried out by means of jets or sprays. In some instances, it may be helpful to use minor quantities of organic solvents such as the short chain aliphatic alcohols and ketones. However, satisfactory development may be accomplished without using any organic solvents. Suitable solvents of these types include methanol, ethanol, and acetone, and they generally will be used in amounts no greater than 25-35%, preferably less than about 1-5% of the water developer. Following development of the plate, residual surface water, and any organic solvent which also might be present, may be removed by passing a current of warm air over the relief.

The printing reliefs made in accordance with this invention can be used in all classes of printing, but are most applicable to those wherein a distinct difference in height between printing and non-printing areas is required. These classes include those wherein the ink is carried by the raised portion of the relief, such as in dry offset printing and ordinary letterpress printing. The printing reliefs also are useful as pattern plates in the preparation of conventional lead stereographic printing plates. Furthermore these reliefs are useful in the area of flexography for book and package printing. In addition to their use in the preparation of printing reliefs, the photopolymer compositions of this invention also may be used as photoresists over an etchable metal. In this instance, a thin layer of the composition will become insolubilized in irradiated areas and protect the metals beneath from etching, as in a photoengraving process. Similarly, the compositions may be used to prepare lithographic plates. Also, they are useful in the preparation of silk screen photostencils.

This invention is illustrated more specifically by the following examples in which all parts are parts by weight unless otherwise specified.

EXAMPLES 1-3

Solutions for film casting were prepared by dissolving one part of each of the three copolymers of ethylene oxide and allyl glycidyl ether, described in Table 1, 0.15 parts of pentaerythritol triacrylate, and 0.04 parts of benzophenone in nine parts of methanol. Films of the three solutions were cast on vinyltriethoxysilane treated grained aluminum sheets using a 50 mil doctor blade. The films were dried in the dark for 24 hours, the thickness after evaporation of the solvent being about 5 mils. Sections of each film were masked with a photographic negative and irradiated for 10 minutes with a 275 watt G.E. sunlamp from a distance of 9 inches. The exposed films were etched in a water bath by rubbing with a nonwoven fabric. In each case a sharp image resulted, the unexposed areas being dissolved away.

TABLE 1

Ethylene Oxide (EO) - Allyl Glycidyl Ether (AGE) Copolymers

| Ex. | % AGE | $[\eta]$* | Approximate Molecular Weight** | RSV (1.0%, $H_2O$, 25°) |
|---|---|---|---|---|
| 1 | 4.6 | 3.58 | $5.1 \times 10^5$ | 8.28 |
| 2 | 9.2 | 3.62 | $5.2 \times 10^5$ | 8.58 |
| 3 | 11.2 | 2.61 | $3.2 \times 10^5$ | 5.34 |

*Intrinsic viscosity determined in water at 25° C.
**Calculated based on poly(ethylene oxide).

EXAMPLES 4-6

Solutions were prepaed by dissolving one part of each of the three copolymers of ethylene oxide and allyl glycidyl ether, described in Table 2, in 10 parts of chloroform, followed by addition of 0.2 parts of pentaerythritol triacrylate and 0.025 parts of benzophenone to each. Films were cast on γ-methacryloxypropyl-trimethoxysilane treated grained aluminum sheets. The films, after drying in the dark were exposed through a Stauffer 21 Step Sensitivity Guide for one minute using a 275 watt G.E. sunlamp from 8 inches. After etching in water, the film of Example 4 provided an image of insoluble polymer visible through step 12; image for Example 5 was visible through step 8; and the image for Example 6 was visible through step 7.

TABLE 2

Ethylene Oxide (EO) - Allyl Glycidyl Ether (AGE) Copolymer

| Ex. | % AGE | $[\eta]$* | Approximate Molecular Weight** | RSV (1.0%, $H_2O$, 25°) |
|---|---|---|---|---|
| 4 | 5 | 2.16 | $2.5 \times 10^5$ | 3.58 |
| 5 | 5 | 1.20 | $1.1 \times 10^5$ | 1.67 |
| 6 | 5 | 0.629 | $4.5 \times 10^4$ | 0.74 |

*Intrinsic viscosity determined in water at 25° C.
**Calculated based on poly(ethylene oxide).

EXAMPLES 7-10

A sample of ethylene oxide-allyl glycidyl ether copolymer containing 4.5% allyl glycidyl ether, with an intrinsic viscosity in water 25° of 2.1 corresponding to a molecular weight of about $2.5 \times 10^5$ was employed. Formulations in chloroform corresponding to the compositions shown in Table 3 were prepared and films cast, dried, exposed through the Stauffer 21 Step Sensitivity Guide, and water etched as described in Examples 4-6. The results obtained are shown in Table 3.

TABLE 3
Variation in Unsaturated Monomers and Sensitizers

| Example | | Formulation[a] | Last crosslinked step, i.e. the last polymer coated area remaining when the unexposed areas are just removed |
|---|---|---|---|
| 7 | 25 | parts pentaerythritol triacrylate | 8 |
| | 2.5 | parts benzophenone | |
| 8 | 25 | parts pentaerythritol triacrylate | 7 |
| | 2.5 | parts benzoin isopropyl ether | |
| 9 | 50 | parts pentaerythritol triacrylate | 9 |
| | 2.5 | parts benzophenone | |
| 10 | 10 | parts methylenebisacrylamide | 11 |
| | 10 | parts dimethylaminoethyl methacrylate | |
| | 2.5 | parts benzophenone | |

[a]Each formulation contained 100 parts ethylene oxide - allyl glycidyl ether copolymer and 0.1 part phenolic antioxidant.

EXAMPLE 11

Into a blender were added 100 parts of the ethylene oxideallyl glycidyl ether copolymer used in Examples 7–10, 25 parts pentaerythritol triacrylate, 2.2 parts of enzophenone and 0.5 part phenolic antioxidant. The mixture was dry blended breaking up any lumps. The mixture was then milled for 6 minutes at 50° C. on a two-roll mill. The milled material in sheet form was placed in a picture frame mold and formed in a compression molding press at 50° C. into a sheet 25 mils thick on an aluminum backing. The sample was exposed to a 2000 watt mercury lamp at a distance of 20 inches through a screened photographic negative for 12 minutes. The exposed plate was etched in a Master Etcher (Master Etcher Machine Co.) for 12 minutes using water at 45 psi pressure. The plate was then dried at 80° for 10 minutes. The thus prepared plate was used in a proofing printing press to print a good reproduction of the negative.

EXAMPLE 12

A formulation containing 100 parts of the ethylene oxideallyl glycidyl ether copolymer of Example 11, 15 parts pentaerythritol triacrylate, 2 parts benzophenone and 1part phenolic antioxidant was prepared as a compression molded sheet on an aluminum backing in the manner described in Example 11. This plate was exposed for 10 minutes, water etched, and dried as described in Example 11. The imaged plate was used in a proofing press to produce a good reproduction of the negative.

An unexposed plate, prepared in the same manner, was stored in the dark at room temperature for 75 days. Upon exposure and water etching, it showed the same results as when initially tested.

EXAMPLES 13–22

Copolymers of ethylene oxide and propylene oxide, epichlorohydrin, methyl glycidyl ether and allyl glycidyl ether, with the compositions and molecular weights listed in Table 4, were converted to supported films in the manner described in Example 11. The formulations consisted of 100 parts of the copolymer, 15 parts of pentaerythritol triacrylate, 2 parts benzophenone and 1 part phenolic antioxidant. The films were exposed through a screened negative and etched with water as described in Example 11 for the times shown in Table 4. In each case, a good reproduction of the negative was produced and the unexposed areas were etched to a depth of about 20 mils.

TABLE 4

| | | Copolymers of Ethylene Oxide | | | |
|---|---|---|---|---|---|
| Example | Comonomer | Comonomer Content | RSV (1.0%, $H_2O$, 25°) | Exposure Time (min.) | Etch Time (min.) |
| 13 | propylene oxide | 25% | 4.24 | 15 | 12 |
| 14 | propylene oxide | 25% | 11.0 | 20 | 35 |
| 15 | propylene oxide | 17.5% | 2.32 | 15 | 10 |
| 16 | propylene oxide | 17.5% | 5.5 | 20 | 15 |
| 17 | propylene oxide | 10% | 4.38 | 15 | 20 |
| 18 | methyl glycidyl ether | 25% | 2.17 | 18 | 15 |
| 19 | methyl glycidyl ether | 10% | 2.22 | 18 | 15 |
| 20 | epichlorohydrin | 10% | 4.0 | 15 | 18 |
| 21 | allyl glycidyl ether | 25% | 3.9 | 10 | 15 |
| 22 | allyl glycidyl ether | 10% | 5.99 | 10 | 18 |

EXAMPLE 23

The composition of Example 16 was modified by substituting 21 parts of triethyleneglycol dimethacrylate for the 15 parts of pentaerythritol triacrylate. The plate prepared by the procedure used for Example 16 was exposed for 30 minutes and etched for 15 minutes. The resulting plate was a good reproduction of the negative with at etch depth of about 20 mils in the unexposed areas.

EXAMPLE 24

The procedure of Example 23 was repeated substituting 15 parts of trimethylolpropane triacrylate for the triethyleneglycol dimethacrylate. The exposure time was 20 minutes and the etch time was 15 minutes. The resulting imaged plate was comparable to that of Example 23.

EXAMPLE 25

The procedure of Example 16 was repeated except that 15 parts of silica having an average particle size of four microns was added to the formulation. The exposure time, etch time, and results were the same.

What I claim and desire to protect by Letters Patent is:

1. A photopolymer composition comprising (1) a water-soluble, thermoplastic ethylene oxide copolymer containing 50–96% ethylene oxide, having a reduced specific viscosity of 0.4 to 50 at 1% concentration in water at 25° C., (2) from about 0.5 to about 25% by weight based on the ethylene oxide copolymer of an ethylenically unsaturated monomer having its unsaturation in the form of at least two

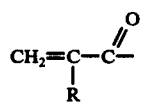

groups, wherein R is hydrogen or a $C_1$–$C_3$ alkyl group, and (3) from about 0.1 to about 10% by weight based on the ethylene oxide copolymer of a photoinitiator thermally stable at temperatures up to about 150° C.

2. The composition of claim 1 wherein the ethylene oxide copolymer is a copolymer of ethylene oxide and an oxirane containing an unsaturated substituent.

3. The composition of claim 2 wherein the oxirane containing an unsaturated substituent is allyl glycidyl ether.

4. The composition of claim 1 wherein the ethylene oxide copolymer is a copolymer of ethylene oxide and an unsaturated comonomer selected from propylene oxide, epichlorohydrin and methyl glycidyl ether.

5. The composition of claim 1 wherein the ethylenically unsaturated monomer is an ethylenically unsaturated monomer having the formula

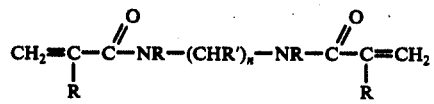

wherein R is hydrogen or a $C_1$–$C_3$ alkyl group; R' is selected from hydrogen, a $C_1$–$C_3$ alkyl group and phenol; and n is 1 to 6 when R' is hydrogen and 1 when R' is a $C_1$–$C_3$ alkyl group or phenyl.

6. The composition of claim 5 wherein the ethylenically unsaturated monomer is N,N'-methylene-bis(acrylamide).

7. The composition of claim 1 wherein the ethylenically unsaturated monomer is an ethylenically unsaturated monomer having the formula

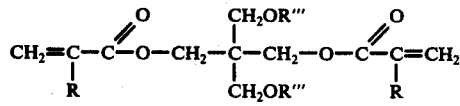

wherein R is hydrogen or a $C_1$–$C_3$ alkyl group and R''' is hydrogen or a

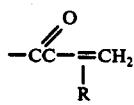

group.

8. The composition of claim 7 wherein the ethylenically unsaturated monomer is pentaerythritol triacrylate.

9. The composition of claim 1 wherein the ethylenically unsaturated monomer is an ethylenically unsaturated monomer having the formula

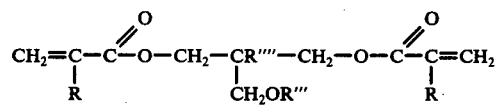

wherein R is hydrogen or a $C_1$–$C_3$ alkyl group; R''' is hydrogen or a

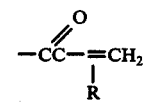

group; and R'''' is a methyl or ethyl group.

10. The composition of claim 9 wherein the ethylenically unsaturated monomer is trimethylolpropane triacrylate.

11. The composition of claim 1 wherein the ethylenically unsaturated monomer is an ethylenically unsaturated monomer having the formula

wherein R is hydrogen or a $C_1$–$C_3$ alkyl group; R''''' is hydrogen or a methyl group; and n is 2 to 4.

12. The composition of claim 11 wherein the ethylenically unsaturated monomer is triethylene glycol dimethacrylate.

13. The composition of claim 1 wherein the photoinitiator is selected from the group of benzophenone and benzoin isopropyl ether.

14. The composition of claim 1 wherein said composition contains up to 55% by weight of an inert particulate filler essentially transparent in the composition.

15. A photopolymer element comprising a support and a layer comprising the composition of claim 1.

16. The photopolymer element of claim 15 wherein said layer comprising the composition is a relief height-forming layer.

17. The photopolymer element of claim 15 wherein said support is a metal and a layer of antihalation material is disposed between said metal and said relief height-forming layer.

18. The photopolymer element of claim 15 wherein said layer comprising the composition contains up to 55% by weight of an inert particulate filler essentially transparent in the layer.

19. The process of making a printing relief which comprises admixing the components of the composition of claim 1, thermoforming the resulting mixture in the form of a sheet, laminating the sheet to a support to form a photopolymer element, exposing to actinic light selected areas of said element until substantial crosslinking takes place in the exposed areas without significant crosslinking in the unexposed areas, and removing the unexposed areas of photopolymer composition by washing the photopolymer element with water.

20. The process of claim 19 wherein the thermoforming step is carried out by means of extrusion.

21. The process of claim 19 wherein residual surface water is removed by passing a current of warm air over the relief.

22. The crosslinked composition formed by exposing the composition of claim 1 to actinic light.

UNITED STATES PATENT AND TRADEMARK OFFICE
CERTIFICATE OF CORRECTION

PATENT NO. : U.S.P. 4,047,963     Page 1 of 3
DATED : September 13, 1977
INVENTOR(S) : David A. Simpson It is certified that error appears in the above-identified patent and that said Letters Patent are hereby corrected as shown below:

Col. 2, Line 10
"(1)" -- should read -- "(2)"

Col. 4, Line 26
"oxetanem" -- should read -- "oxetane,"

Col. 4, Line 31
"3-$\beta$" -- should read -- "3-$\gamma$"

Col. 4, Line 32
"oxetame" -- should read -- "oxetane"

Col. 4, Line 37
"3-$\beta$" -- should read -- "3-$\omega$"

Col. 6, Line 1
"crylamide," -- should read -- "crylamide),"

Col. 6, Line 42
"di($\gamma$-propylacrylate," -- should read -- "di($\gamma$-propylacrylate)"

Col. 6, Line 60-65

$$-C\overset{O}{\underset{R}{C}}=CH_2$$ -- should read -- $$-\overset{O}{C}-\underset{R}{C}=CH_2$$

Col. 7, Lines 1-5

$$CH_2=\underset{R}{C}-\overset{O}{C}-O-CH_2-\underset{CH_2-OR'''}{C}-CH_2-O-\overset{O}{C}-\underset{R}{C}=CH_2$$ -- should read -- $$CH_2=\underset{R}{C}-\overset{O}{C}-O-CH_2-\overset{CH_2-OR'''}{\underset{CH_2-OR'''}{C}}-CH_2-O-\overset{O}{C}-\underset{R}{C}=CH_2$$

UNITED STATES PATENT AND TRADEMARK OFFICE
CERTIFICATE OF CORRECTION

PATENT NO. : U.S.P. 4,047,963
DATED : September 13, 1977
INVENTOR(S) : David A. Simpson Page 2 of 3

It is certified that error appears in the above-identified patent and that said Letters Patent are hereby corrected as shown below:

Col. 7, Lines 10-15
Col. 7, Lines 25-30

Col. 7, Lines 15-20

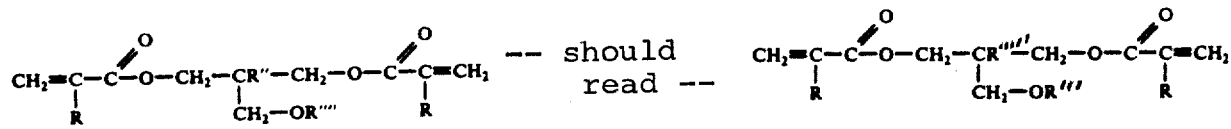

Col. 9, Line 24
"ot" -- should read -- "of"

Col. 10, Line 29
"prepaed" -- should read -- "prepared"

Col. 10, Line 62
"water 25°" -- should read -- "water at 25°"

Col. 11, Line 24
"enzophenone" -- should read -- "benzophenone"

UNITED STATES PATENT AND TRADEMARK OFFICE
CERTIFICATE OF CORRECTION

PATENT NO. : 4,047,963

DATED : September 13, 1977

INVENTOR(S) : David A. Simpson

It is certified that error appears in the above-identified patent and that said Letters Patent are hereby corrected as shown below:

Col. 13, Claim 7
Col. 14, Claim 9

$$"-CC\overset{O}{\underset{R}{=}}CH_2" \quad \text{-- should read --} \quad "-\overset{O}{C}-\underset{R}{C}=CH_2"$$

Signed and Sealed this

Twenty-fourth Day of January 1978

[SEAL]

Attest:

RUTH C. MASON
Attesting Officer

LUTRELLE F. PARKER
Acting Commissioner of Patents and Trademarks